(12) United States Patent
Alawieh et al.

(10) Patent No.: US 10,714,406 B2
(45) Date of Patent: Jul. 14, 2020

(54) ELECTRONIC POWER MODULE AND ELECTRICAL POWER CONVERTER INCORPORATING SAME

(71) Applicant: INSTITUT VEDECOM, Versailles (FR)

(72) Inventors: Hadi Alawieh, Sotteville-les-Rouen (FR); Menouar Ameziani, Guyancourt (FR)

(73) Assignee: INSTITUT VEDECOM, Versailles (FR)

( * ) Notice: Subject to any disclaimer, the term of this patent is extended or adjusted under 35 U.S.C. 154(b) by 0 days.

(21) Appl. No.: 16/604,524

(22) PCT Filed: Apr. 9, 2018

(86) PCT No.: PCT/FR2018/050883
§ 371 (c)(1),
(2) Date: Nov. 22, 2019

(87) PCT Pub. No.: WO2018/189468
PCT Pub. Date: Oct. 18, 2018

(65) Prior Publication Data
US 2020/0152547 A1 May 14, 2020

(30) Foreign Application Priority Data
Apr. 13, 2017 (FR) .................................. 17 53254

(51) Int. Cl.
*H01L 23/427* (2006.01)
*F28D 15/04* (2006.01)
*H01L 25/07* (2006.01)

(52) U.S. Cl.
CPC ............ *H01L 23/427* (2013.01); *F28D 15/04* (2013.01); *H01L 25/071* (2013.01)

(58) Field of Classification Search
CPC ................. H01L 23/427; H01L 23/367; H01L 2023/4068; F28D 15/04
(Continued)

(56) References Cited

U.S. PATENT DOCUMENTS

2005/0117303 A1 6/2005 Nagahashi
2009/0236719 A1 9/2009 Shim et al.
(Continued)

OTHER PUBLICATIONS

International Search Report for PCT/FR2018/050883 dated Jul. 17, 2018.
Written Opinion for PCT/FR2018/050883 dated Jul. 17, 2018.

*Primary Examiner* — Walter H Swanson
(74) *Attorney, Agent, or Firm* — Sandberg Phoenix & von Gontard, P.C.

(57) ABSTRACT

The module (PM1) has an architecture with 3D stacking of the electronic power switching chips (IT, ID) and comprises first and second dielectric substrates (SH, SL) that are intended to come into thermal contact with first and second heat sinks (DH, DL), respectively, at least one pair of first and second stacked electronic power switching chips ($IT_{HS}$, $ID_{HS}$; $IT_{HS}$, $ID_{HS}$) and a common intermediate substrate (SC), the first and second electronic power switching chips being sandwiched between the first dielectric substrate and the common intermediate substrate and between the common intermediate substrate and the second dielectric substrate, respectively. According to the invention, the common intermediate substrate is a metal element formed as a single piece and comprises a central portion for the implantation of the electronic power switching chips and at least one.

10 Claims, 4 Drawing Sheets

(58) Field of Classification Search
USPC .......................................................... 257/713
See application file for complete search history.

(56) References Cited

U.S. PATENT DOCUMENTS

2013/0056864 A1 3/2013 Cho et al.
2016/0005675 A1 1/2016 Tong

ELECTRONIC POWER MODULE AND ELECTRICAL POWER CONVERTER INCORPORATING SAME

CROSS-REFERENCE TO RELATED APPLICATIONS

This application is the U.S. National Stage under 35 USC § 371 of International Application No. PCT/FR2018/050883, filed 9 Apr. 2018 which claims priority to French application 1753254, filed 13 Apr. 2017, the content (text, drawings and claims) of both applications being incorporated herein by reference.

BACKGROUND

The invention deals in general with the field of power electronics. More particularly, the invention relates to an electronic power module having a 3D architecture for arranging electronic power switching chips. The invention further relates to electrical power converters, such as inverters.

Electronic power circuits are present in numerous fields of activity and, in particular, in the field of transport. In the last few decades, converters and electronic power modules have undergone considerable development, in particular in electric rail traction. With the desired energy switchover toward renewable energy sources that produce fewer $CO_2$ emissions, there is a need for power electronics to be generalized even further and to meet increasing economic and technological constraints. In the field of transport, the automotive industry is subject to very restrictive emission and pollution discharge standards, which are leading to a real technological shift, with electrification of vehicles through hybrid or fully electrical architectures. Hybridization of airplane engines is also on the agenda for reducing $CO_2$ emissions.

Conventionally, power modules are constructed with a planar arrangement of the electronic chips. In this planar arrangement, the rear faces of the chips are fixed to a substrate, and interconnection wires, known as bonding wires, are used to establish electrical connections on the front faces of the chips. The substrate, for example in the form of a ceramic lined with copper plates, performs a thermal interface function with a cooling device and an electrical insulation function.

This traditional planar architecture is not optimized in terms of compactness and cost, and has other drawbacks. The cooling of the chips only occurs through one of the faces thereof. The parasitic inductances, introduced in particular by the bonding wires and the electrical connecting tapes, generate overvoltages that increase the heat released and are potentially destructive. Moreover, the parasitic inductances conflict with higher switching frequencies, but these are favorable for compactness, in particular in power converters.

The 3D stacking of the chips is a promising path for improving the compactness of power modules and reducing parasitic inductances. An increased level of integration is generally also favorable for reducing costs. On the other hand, the 3D architecture accentuates the thermal constraints on the components.

US20160005675A1 discloses a power module having a 3D architecture. This power module 100 is shown herein in FIG. 1. The module 100 is cooled through the high-side and low-side faces thereof. The high-side and low-side faces comprise high-side and low-side heat sinks, 106 and 110, respectively. The 3D stack of the module 100 comprises a high-side electronic chip 220, a low-side electronic chip 210 and an interconnecting intermediate substrate 212 sandwiched between the chips 220 and 210. The chips 220 and 210 are soldered to the heat sinks 106 and 110, respectively, via one of the faces thereof and to the interconnecting intermediate substrate 212 via another of the faces thereof. An overmolding resin 108 provides tightness and mechanical cohesion of the module. The interconnecting intermediate substrate 212 is in this case a type of DCB (direct copper bond) or DBA (direct bonded aluminum) that comprises a central dielectric plate 224 lined on both sides with metal layers 216 and 217 of copper (DCB) or aluminum (DBA). The dielectric central plate 224 is a ceramic or a polyimide such as Kapton (registered mark).

The 3D stack implemented in the prior art power module 100 makes higher compactness possible. However, the electronic chips 210 and 220 are only cooled through a single face. An arrangement of this type may be found to be insufficient to guarantee high reliability at high power, at acceptable costs, by keeping the junction temperatures of the electronic chips below critical values.

SUMMARY

It is desirable to provide an improved power module of the type having 3D stacking of the electronic chips and having an architecture that guarantees high-performance cooling.

In a first aspect, an electronic power module having an architecture with 3D stacking, comprises first and second dielectric substrates that are intended to come into thermal contact with first and second heat sinks, respectively, at least one pair of first and second stacked electronic power switching chips and a common intermediate substrate, the first and second electronic power switching chips being sandwiched between the first dielectric substrate and the common intermediate substrate and between the common intermediate substrate and the second dielectric substrate, respectively. The common intermediate substrate is a metal element formed as a single piece and comprises a central portion for the implantation of the electronic power switching chips and at least one thermal conduction portion that is in thermal contact with the first dielectric substrate and/or the second dielectric substrate.

In general, it will be noted that the term "electronic power switching chip" used herein refers to any power semiconductor component that performs switching, such as a transistor, a diode or other components.

In one particular embodiment, the common intermediate substrate has an H-shaped section and comprises two lateral thermal conduction portions on either side of the central portion, the lateral thermal conduction portions being in thermal contact with the first and second dielectric substrates.

In accordance with a particular feature, the common intermediate substrate comprises at least one heat pipe, of the capillary or pulsating type, arranged so as to provide heat transfer from the central portion toward the lateral thermal conduction portions.

In one embodiment, the common intermediate substrate comprises a heat transfer fluid circulation coil arranged so as to provide heat transfer from the common intermediate substrate toward an external exchanger.

In accordance with another particular feature, first electrode faces of the first and second electronic power switching chips are soldered directly to corresponding faces of the common intermediate substrate.

In accordance with yet another particular feature, second electrode faces of the first and second electronic power switching chips are soldered to first and second metal electrical connection plates, respectively, the first and second metal electrical connection plates being fixed against the first and second dielectric substrates, respectively.

In another particular embodiment, the electronic power module comprises at least a third electronic power switching chip, having a height difference from at least one of the first and second electronic power switching chips, and the common intermediate substrate and/or at least one of the first and second metal electrical connection plates comprise at least one change in level for compensating a difference in thickness, for the implantation of the electronic power switching chips.

In accordance with another particular feature, the electronic power module comprises hemispherical spars to which the electronic power switching chips are soldered.

In accordance with yet another particular feature, the common intermediate substrate and the first and second metal electrical connection plates are made of copper or aluminum.

In another aspect, an electrical power converter comprises at least one electronic power module as described briefly above.

DESCRIPTION OF THE FIGURES

Other advantages and features of the present invention will be more clearly apparent from reading the following detailed description of several particular embodiments of the invention, with reference to the accompanying drawings, in which.

DETAILED DESCRIPTION

The invention is described below in the context of implementing a power module in the form of a transistor switching bridge or half-bridge branch. A bridge branch of this type constitutes an electrical power converter in the form of a single-phase inverter. These modules may be joined to form complete switching bridges such as multiphase inverters or be connected in parallel to conduct the desired current.

Figure 1:
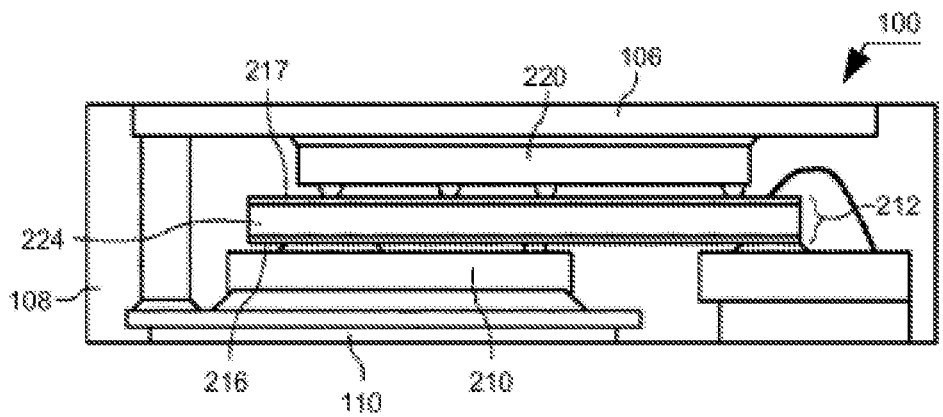
FIG. 1 is a sectional view of a prior art electronic power module with a 3D stack architecture.
Figure 2:
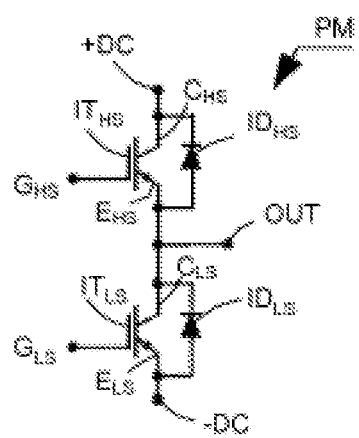
FIG. 2 is a circuit diagram of a transistor bridge branch with IGBT transistors.

A circuit diagram of a power module PM of this type, with IGBT transistors, is shown in FIG. 2.

As is shown in FIG. 2, the power module PM comprises a high-side IGBT transistor $IT_{HS}$ and a low-side IGBT transistor $IT_{LS}$. Freewheel diodes $ID_{HS}$ and $ID_{LS}$ are connected to the transistors $IT_{HS}$ and $ID_{LS}$, respectively. The diodes $ID_{HS}$, $ID_{LS}$ are mounted between the collector electrodes $C_{HS}$, $C_{LS}$ and the emitter electrodes $E_{HS}$, $E_{LS}$ of the transistors $IT_{HS}$, $IT_{LS}$, respectively. The collector electrode $C_{HS}$ of the transistor $IT_{HS}$ is linked to a positive direct voltage +DC, and the emitter electrode $E_{LS}$ of the transistor $IT_{LS}$ is linked to a negative direct voltage −DC. The transistors $IT_{HS}$ and $IT_{LS}$ are switch-controlled via the respective gate electrodes $G_{HS}$ and $G_{LS}$ thereof. The output OUT of the module PM corresponds to the interconnection point of the emitter $E_{HS}$ and collector $C_{LS}$ electrodes of the transistors $IT_{HS}$ and $IT_{LS}$ and supplies an alternating voltage.

In the power module PM described here, it is considered that the transistors $IT_{HS}$ and $IT_{LS}$ and the associated diodes $ID_{HS}$ and $ID_{LS}$ are distinct chips. It will be noted that, in some configurations, the diodes associated with the transistors will already be integrated into the chips of the transistors, in such a way that it will not be necessary to implant them. It will also be noted that the power module can equally well be implemented with different power interrupters, such as MOSFET transistors or GTO thyristors.

Referring to FIGS. 3 to 6C, a first particular embodiment PM1 of the power module is now described.

Figure 3:
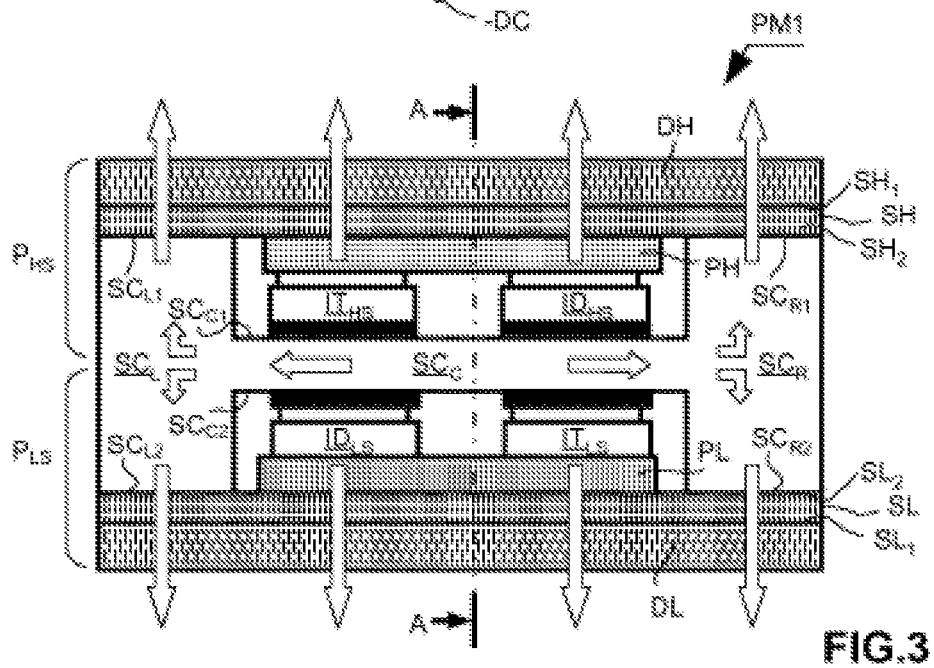
FIGS. 3 and 4 are simplified sectional views of a first embodiment of an electronic power module, the sectional view of FIG. 4 being taken along the line A-A of FIG. 3.
Figure 4:
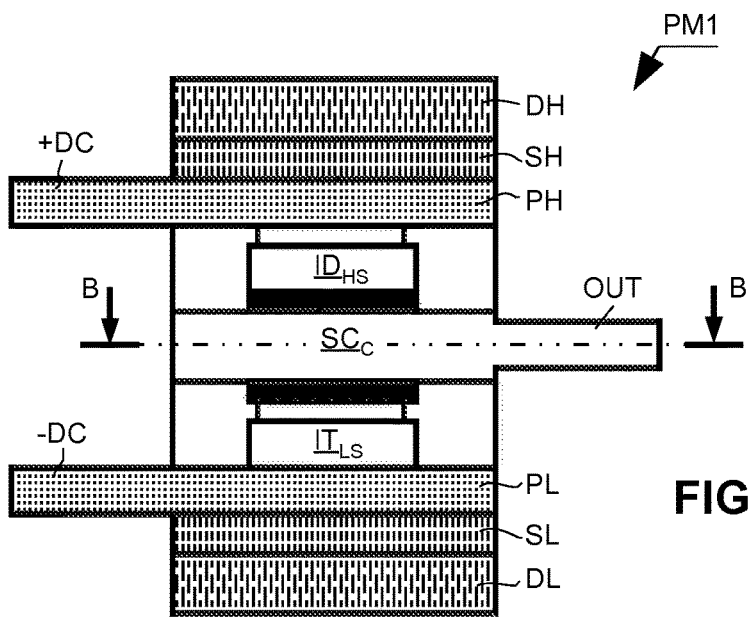

As is shown in FIGS. 3 and 4, the power module PM1 is formed with a 3D stack of electronic chips $IT_{HS}$, $ID_{HS}$ and $IT_{LS}$, $ID_{LS}$. The power module PM1 comprises a high-side part $P_{HS}$ and a low-side part $P_{LS}$ in which the transistor $IT_{HS}$ and its associated diode $ID_{HS}$ and the transistor $IT_{LS}$ and its associated diode $ID_{LS}$, respectively, are arranged. The high-side $P_{HS}$ and low-side $P_{LS}$ parts share a common intermediate substrate SC.

The high-side part $P_{HS}$ basically comprises a high-side dielectric substrate, a high-side metal electrical connection plate PH, and a first, high-side heat sink DH. The low-side part basically comprises a low-side dielectric substrate SL, a low-side metal electrical connection plate PL, and a second, low-side heat sink DL.

The dielectric substrates SH and SL are typically ceramic substrates. The metal electrical connection plates PH and PL are typically copper plates intended for electrically connecting electronic chips. The substrate SH, SL comprises a first face $SH_1$, $SL_1$, against which the heat sink DH, DL is fixed, and a second face $SH_2$, $SL_2$, against which the metal plate PH, PL is fixed. Techniques known to a person skilled in the art are used for fixing the heat sinks and metal plates to the high-side and low-side dielectric substrates with a very good thermal conductivity.

The common intermediate substrate SC is a metal element formed as a single piece, which has to be an excellent electrical and thermal conductor. Typically, the common intermediate substrate SC is made of copper.

As is apparent in FIG. 3, the common intermediate substrate SC has an H-shaped section and comprises a central portion $SC_C$ and two lateral thermal conduction portions $SC_L$ and $SC_R$ that are perpendicular to the central portion $SC_C$ and located on either side of the central portion $SC_C$. The central portion $SC_C$ is for implanting electronic chips. The lateral portions $SC_L$ and $SC_R$, referred to here as "left" and "right", are for transferring heat from the central portion $SC_C$ toward the heat sinks DH and DL.

Figure 5:
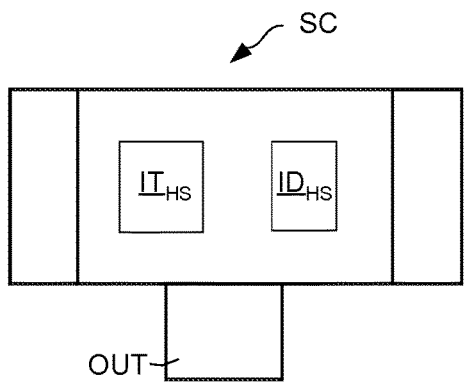
FIG. 5 is a top view showing an implantation of electronic power switching chips in a common intermediate substrate included in the electronic power module of FIGS. 3 and 4.

The chips $IT_{HS}$ and $ID_{HS}$ are implanted in the high-side part $P_{HS}$ of the module PM1. FIG. 5 shows the implantation of the chips $IT_{HS}$ and $ID_{HS}$ on the common intermediate substrate SC.

As is shown in FIG. 3, the collector electrode ($C_{HS}$, FIG. 2) of the transistor $IT_{HS}$ and the cathode electrode of the diode $ID_{HS}$ are soldered to the high-side metal plate PH. The emitter electrode ($E_{HS}$, FIG. 2) of the transistor $IT_{HS}$ and the anode electrode of the diode $ID_{HS}$ are soldered to a high-side face $SC_{C1}$ of the central portion $SC_C$ of the common intermediate substrate SC. In general, it will be noted in this context that the terms "soldered" and "soldering" as used herein are to be interpreted broadly, and cover various techniques for implementing electrical connections by applying material that are used in power electronics, such as brazing, sintering-brazing, and other techniques.

The chips $IT_{LS}$ and $ID_{LS}$ are implanted in the low-side part $P_{LS}$ of the module PM1. The emitter electrode ($E_{LS}$, FIG. 2) of the transistor $IT_{LS}$ and the anode electrode of the diode $ID_{LS}$ are soldered to the low-side metal plate PL. The collector electrode ($C_{LS}$, FIG. 2) of the transistor $IT_{LS}$ and the cathode electrode of the diode $ID_{LS}$ are soldered to a low-side face $SC_{C2}$ of the central portion $C_C$ of the common intermediate substrate SC.

The gate electrodes $G_{HS}$, $G_{LS}$ of the transistors $IT_{HS}$, $IT_{LS}$ (not shown in FIG. 3) are typically connected to copper connection patterns supported by the dielectric substrates SH, SL.

As is shown in FIG. 4, which is a view in the section plane A-A (FIG. 3), the metal plates PH, PL and the central portion $SC_C$ extend exteriorly of the module PM1 to form electrical connection pads for the direct voltages +DC, −DC and the output OUT.

As is shown in FIG. 3, the lateral thermal conduction portions $SC_L$, $SC_R$ of the common intermediate substrate SC, for heat discharge, comprise high-side and low-side faces that are fixed to the high-side and low-side dielectric substrates SH, SL. More precisely, for the left lateral portion $SC_L$, a high-side face $SC_{L1}$ thereof is fixed to the second face $SH_2$ of the high-side dielectric substrate SH and a low-side face $SC_{L2}$ is fixed to the second face $SL_2$ of the low-side dielectric substrate SL. For the right lateral portion $SC_R$, a high-side face $SC_{R1}$ thereof is fixed to the second face $SH_2$ of the high-side dielectric substrate SH and a low-side face $SC_{R2}$ is fixed to the second face $SL_2$ of the low-side dielectric substrate SL. The technique used to implement fixing of the lateral thermal conduction portions $SC_L$, $SC_R$ to the dielectric substrates SH, SL will be selected to guarantee very high thermal conductivity.

As a result of the common intermediate substrate SC, with the lateral thermal conduction portions $SC_L$, $SC_R$ thereof, in thermal conduction with the heat sinks DH, DL, the module makes real two-sided cooling of the electronic chips possible in an architecture having a 3D stack.

As is shown by the double-lined arrows in FIG. 3, the heat generated by the module PM1 is discharged as follows:

The high-side faces of the transistor $IT_{HS}$ and diode $ID_{HS}$ dissipate the heat via the high-side heat sink DH.

The low-side faces of the transistor $IT_{LS}$ and diode $ID_{LS}$ dissipate the heat via the low-side heat sink DL.

The faces soldered to the common intermediate substrate SC of the transistors $IT_{HS}$, $IT_{LS}$ and diodes $ID_{HS}$, $ID_{LS}$ dissipate heat via the two heat sinks DH and DL, this heat being brought to the heat sinks DH, DL by the lateral thermal conduction portions $SC_L$, $SC_R$.

Figure 6A:
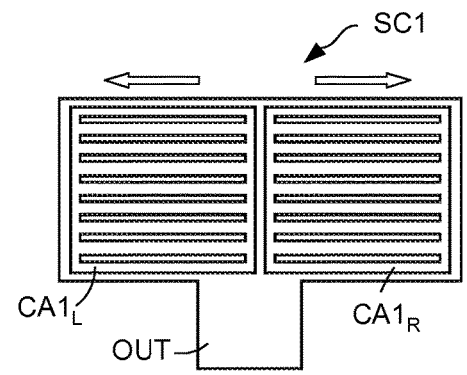
FIG. 6A to 6C are sectional views taken along line B-B of FIG. 4 showing three embodiments of the common intermediate substrate of FIG. 5, incorporating heat pipes of the capillary, heat pipes of the pulsating type, and a heat transfer fluid circulation coil, respectively.
Figure 6B:
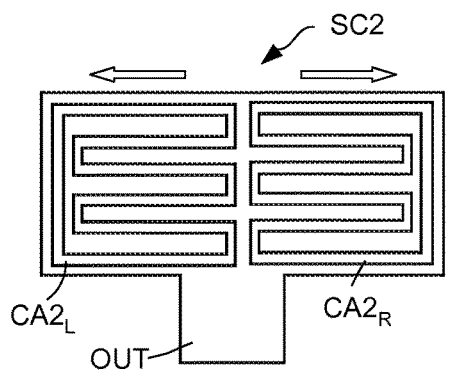
Figure 6C:
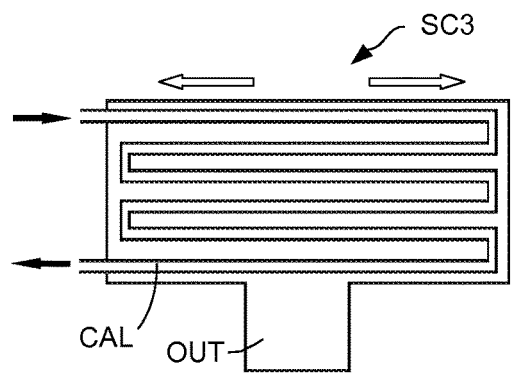

FIGS. 6A to 6C shows three alternate embodiments SC1, SC2 and SC3 of the common intermediate substrate that make possible an increase in the amount of heat discharged by this substrate. FIGS. 6A to 6C are views in the section plane B-B shown in FIG. 4.

The common intermediate substrates SC1 and SC2 shown in FIG. 6A and 6B integrate heat pipes $CA1_L$, $CA1_R$ and $CA2_L$, $CA2_R$ into their copper bodies, so as to increase their thermal conductivity and discharge more heat. The temperature of the electronic chips can thus be reduced. The heat pipes $CA1_L$, $CA1_R$ of the substrate SC1 are of the capillary type. The heat pipes $CA2_L$, $CA2_R$ of the substrate SC2 are of the pulsating type. The micro-ducts of the heat pipes are implemented using techniques known to a person skilled in the art, which will not be detailed here.

As is shown by the double-lined arrows in FIG. 6A and 6B, the heat is discharged from the central part of the common intermediate substrates SC1, SC2 toward the lateral thermal conduction portions $SC_L$, $SC_R$, which lead to the heat sinks DH, DL. In a known manner, the heat is transferred using the evaporation-condensation cycle of the heat transfer fluid contained in the heat pipes.

The fact that the chips are soldered directly to the common intermediate substrate SC1, SC2, in the central portion $SC_C$ containing the heat pipes, makes the heat discharge more effective. The heat pipes may have reduced dimensions, since a large proportion of the heat is discharged directly toward the two heat sinks DH, DS, via the copper mass of the common intermediate substrate, without passing through the heat pipes. This arrangement makes it possible to obtain a power module having good mechanical rigidity, in spite of the presence of the micro-ducts of the heat pipes.

In the common intermediate substrate SC3 shown in FIG. 6C, the heat pipes are replaced with a heat transfer fluid circulation coil CAL intended to be connected to an external heat exchanger (not shown). This embodiment is suitable, for example, for very high powers.

Figure 7:
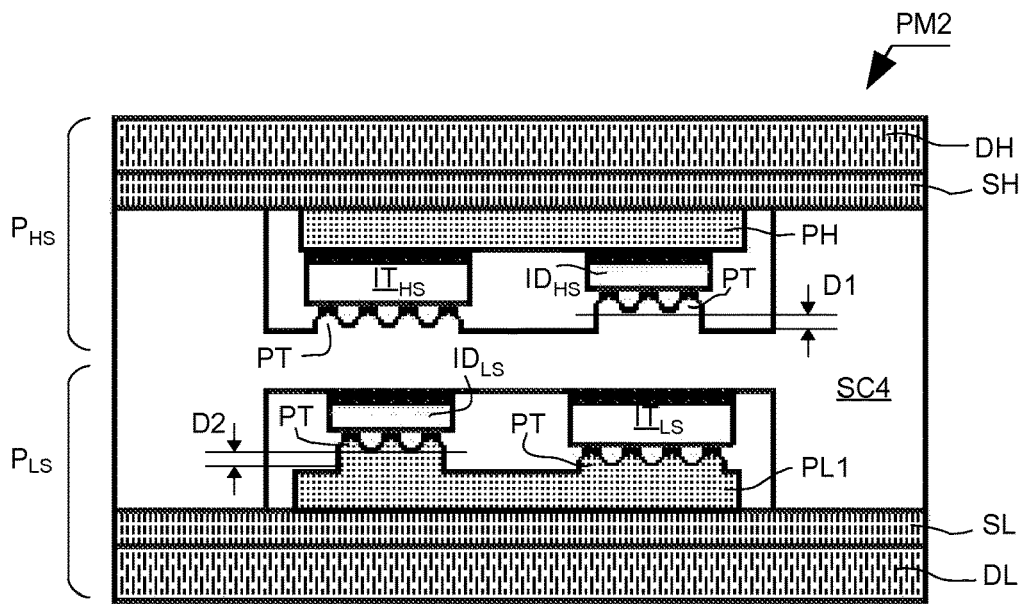
FIG. 7 is a simplified sectional view showing a second embodiment of an electronic power module.
Figure 8:
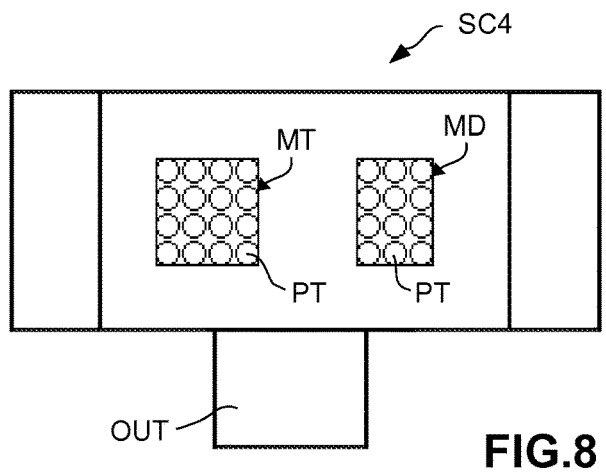
FIG. 8 is a top view showing an implantation of hemispherical spars for soldering the electronic power switching chips in a common intermediate substrate included in the electronic power module of FIG. 7.

Referring to FIGS. 7 and 8, a second particular embodiment PM2 of the power module is now described. Naturally, the embodiments with a heat pipe or coil that are described above also apply to this embodiment.

The architecture of the power module PM2 is suitable when chips of different thicknesses are integrated into the module, for example, thicknesses differing between the transistor chips and the diode chips.

In the state of the art, wedges are usually resorted to for compensating for a difference in thickness between the chips. These wedges require welding on two sides, namely one face on the copper plane of the support (copper substrate or plate) and another on the chip. The introduction of wedges reduces the thermal conductivity between the chips and the heat sinks and increases the energy losses as a result of the additional soldering layers necessary for fixing them to the supports.

The differences in thickness between the chips are compensated for by introducing localized changes in level on the supports. Thus, in the power module PM2, which comprises diode chips $ID_{HS}$, $ID_{LS}$ having a thickness less than that of the transistor chips $IT_{HS}$, $IT_{LS}$, changes in level D1 and D2 are introduced into the common intermediate substrate SC4 and the metal plate PL1, respectively. The changes in level D1, D2 are localized here in the soldering regions of the diode chips, and compensate for the lesser thickness of the diode chips. The introduction of wedges and, relatedly, of additional soldering layers is thus avoided.

As is apparent in FIGS. 7 and 8, patterns MT and MD comprising hemispherical spars PT are implemented on the common intermediate substrate SC4 and the metal plate PL1. The patterns MT are implemented in the soldering zone of the transistors, and the patterns MD are implemented in the soldering zone of the diodes. The hemispherical spars bring about improved adherence in the connection of the chips to the supports thereof, as regards thermomechanical constraints.

It will be noted that the changes in level D1, D2 and the patterns MT, MD with the hemispherical spars PT will be implemented for example by engraving the supports SC4, PL1.

Referring to FIG. 7, in the high-side part $P_{HS}$ of the module MP2, metal-coated faces of the chips $IT_{HS}$ and $ID_{HS}$ are soldered directly to the metal plate PH (corresponding to the voltage +DC), while the opposing faces thereof are soldered to the hemispheres PT engraved on the common intermediate substrate SC4, typically by means of sintering-brazing. In the low-side part $P_{LS}$ of the module MP2, metal-coated faces of the chips $IT_{LS}$ and $ID_{LS}$ are soldered directly to the common intermediate substrate SC4, while the opposing faces thereof are soldered to the hemispheres PT engraved on the metal plate PL1 (corresponding to the voltage −DC), typically by means of sintering-brazing.

Figure 9:
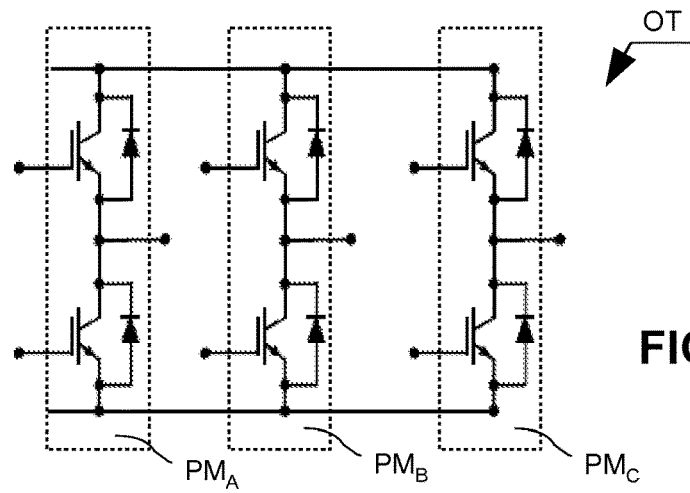
FIG. 9 is a circuit diagram of an electrical power converter in the form of a three-phase inverter, with IGBT transistors.
Figure 10:
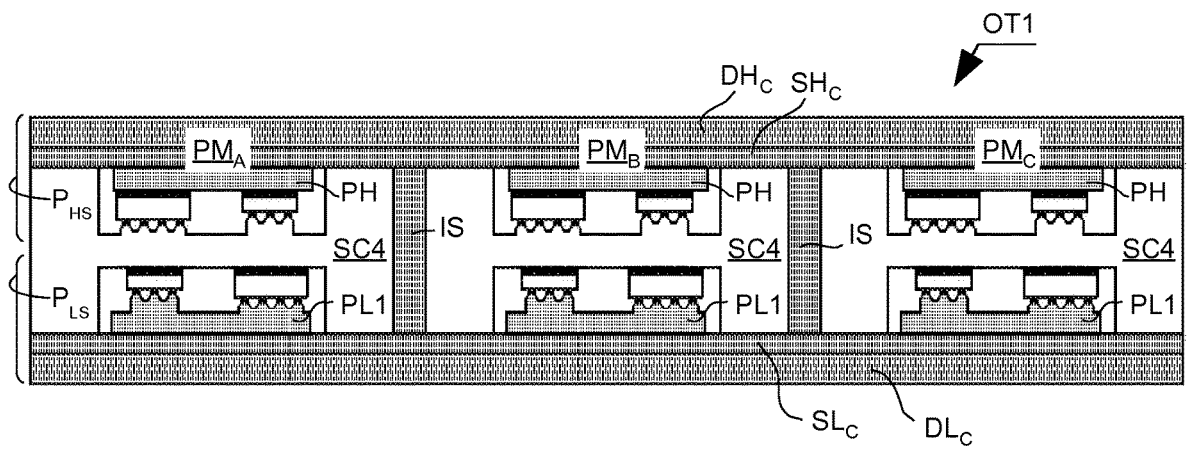
FIGS. 10 and 11 show two embodiments of the three-phase inverter of FIG. 9, with a horizontal arrangement and a vertical arrangement, respectively, of the power modules.
Figure 11:
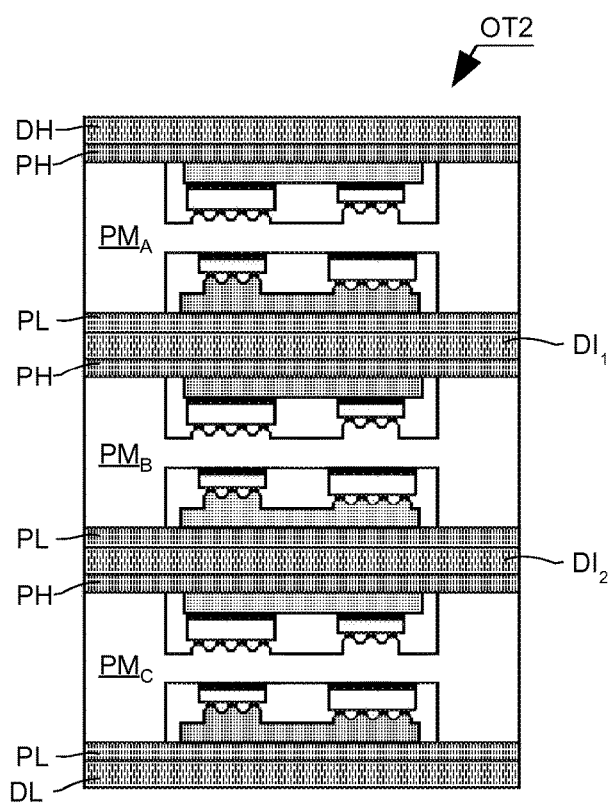

Referring to FIGS. 9 to 11, two embodiments of an electrical power converter in the form of a three-phase inverter, obtained by connecting three power modules, are now described. Naturally, the inverter can have any number of phases.

The circuit diagram of the three-phase inverter OT is shown in FIG. 9. It comprises three power modules $PM_A$, $PM_B$ and $PM_C$ connected in parallel and each forming a switching branch of the inverter OT.

A first embodiment, shown in FIG. 10, is obtained by arranging the power modules horizontally.

In this embodiment, the high-side metal plates PH of the power modules $PM_A$, $PM_B$ and $PM_C$ are fixed to a common heat sink $DH_C$ of the high-side part $P_{HS}$ via a common dielectric substrate $SH_C$, typically made of ceramic. The low-side metal plates PL1 of the modules are fixed to a common heat sink $DL_C$ of the low part $P_{LS}$ via a common dielectric substrate $SL_C$, typically made of ceramic. Insulating dielectric walls IS, typically made of ceramic, are provided for electrically insulating the lateral thermal conduction stretches with respect to the common substrates SC4. The electrical connections between the modules for obtaining the inverter are implemented with an external connector (not shown), which it will be possible to integrate into some applications.

A second embodiment, shown in FIG. 11, is obtained by arranging the power modules vertically. In this embodiment, intermediate heat sinks $DI_1$ and $DI_2$ are shared between the low-side part $P_{LS}$ of the module $PM_A$ and the high-side part $P_{HS}$ of the module $PM_B$ and between the low-side part $P_{LS}$ of the module $PM_B$ and the high-side part $P_{HS}$ of the module $PM_C$. As in the embodiment of FIG. 10, the electrical connections between the modules for obtaining the inverter are implemented using an external connector, which it will optionally be possible to integrate into some applications.

The choice of a horizontal or vertical arrangement of the power modules for implementing the inverter will basically be guided by shape and space constraints.

It will be noted that in some embodiments it will be possible for the metal electrical connection plates and/or the common intermediate substrate to be implemented in aluminum instead of copper. In general, recourse will be had to different techniques in which a person skilled in the art is proficient so as to implement a power module. Thus, to implement the common intermediate substrate, it will be possible for example to resort to techniques such as engraving, mechanical removal of material by machining, laser or plasma cutting, die forging, molding or cutting of copper or aluminum profiles.

The invention is not limited to the particular embodiments described herein by way of example. Depending on the applications of the invention, a person skilled in the art will be able to provide different modifications and variants that fall within the scope of the accompanying claims.

The invention claimed is:

1. Electronic power module having an architecture with 3D stacking, comprising first and second dielectric substrates that are intended to come into thermal contact with first and second heat sinks, respectively, at least one pair of first and second stacked electronic power switching chips and a common intermediate substrate, said first and second electronic power switching chips being sandwiched between said first dielectric substrate and said common intermediate substrate and between said common intermediate substrate and said second dielectric substrate, respectively, wherein said common intermediate substrate is a metal element formed as a single piece and comprises a central portion for implanting said electronic power switching chips, and a thermal conduction portion that is in thermal contact with said first dielectric substrate and/or said second dielectric substrate.

2. Electronic power module according to claim 1, wherein said common intermediate substrate has an H-shaped section and comprises two lateral thermal conduction portions, there being one of the two lateral thermal conduction portions on either side of said central portion ($SC_C$), said lateral thermal conduction portions being in thermal contact with the first and second dielectric substrates.

3. Electronic power module according to claim 2, wherein said common intermediate substrate comprises at least one heat pipe, of a capillary or pulsating type, arranged so as to provide heat transfer from said central portion toward said lateral thermal conduction portions.

4. Electronic power module according to claim 2, wherein said common intermediate substrate comprises a heat transfer fluid circulation coil arranged so as to provide heat transfer from said common intermediate substrate toward an external exchanger.

5. Electronic power module according to claim 1, wherein first electrode faces of said first and second electronic power switching chips are soldered directly to corresponding faces of said common intermediate substrate.

6. Electronic power module according to claim 5, wherein second electrode faces of said first and second electronic power switching chips are soldered to first and second metal electrical connection plates, said first and second metal electrical connection plates being fixed against the first and second dielectric substrates, respectively.

7. Electronic power module according to claim 6, wherein said power module comprises at least a third electronic power switching chip, having a height difference from at least one of the first and second electronic power switching chips, and in that said common intermediate substrate and/or at least one of said first and second metal electrical connection plates comprises at least one change in level for compensating for a difference in thickness, for the implantation of the electronic power switching chips.

8. Electronic power module according to claim 5, wherein said power module comprises hemispherical posts to which the electronic power switching chips are soldered.

9. Electronic power module according to claim 6, wherein said common intermediate substrate and said first and second metal electrical connection plates are made of copper or aluminum.

10. Electrical power converter, comprising at least one electronic power module according to claim 1.

* * * * *